United States Patent
Oehm

(10) Patent No.: US 7,098,752 B2
(45) Date of Patent: Aug. 29, 2006

(54) CIRCUIT ARRANGEMENT FOR GENERATING A REFERENCE CURRENT AND OSCILLATOR CIRCUIT HAVING THE CIRCUIT ARRANGEMENT

(75) Inventor: Jürgen Oehm, Ratingen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/931,173

(22) Filed: Aug. 31, 2004

(65) Prior Publication Data

US 2005/0077972 A1    Apr. 14, 2005

Related U.S. Application Data

(63) Continuation of application No. PCT/DE03/00308, filed on Feb. 4, 2003.

(30) Foreign Application Priority Data

Mar. 1, 2002   (DE) ................. 102 09 044

(51) Int. Cl.
*H03B 5/10* (2006.01)
*H03J 7/04* (2006.01)
*H03L 7/099* (2006.01)

(52) U.S. Cl. .................. 331/177 R; 331/185; 331/186; 327/538

(58) Field of Classification Search ............ 331/177 R, 331/185, 186; 327/538–543
See application file for complete search history.

(56) References Cited

U.S. PATENT DOCUMENTS

| | | | |
|---|---|---|---|
| 5,440,277 A | 8/1995 | Ewen et al. | |
| 5,642,066 A * | 6/1997 | Burke | ......................... 327/132 |
| 5,722,052 A | 2/1998 | Abdi et al. | |
| 5,770,962 A | 6/1998 | Aebischer | |
| 5,787,134 A * | 7/1998 | Kovacs | ....................... 375/376 |
| 5,880,579 A | 3/1999 | Wei et al. | |
| 5,929,620 A | 7/1999 | Dobkin et al. | |
| 6,157,180 A | 12/2000 | Kuo | |
| 6,281,758 B1 | 8/2001 | Elsayed et al. | |
| 6,411,171 B1 | 6/2002 | Itoh | |
| 2001/0019294 A1 | 9/2001 | Itoh | |

FOREIGN PATENT DOCUMENTS

DE    198 42 305 A1    4/2000

OTHER PUBLICATIONS

Search report for PCT/DE03/00308 dated Feb. 10, 2003.*
"Demonstration of a Switched Resonator Concept in a Dual-Band Monolithic CMOS LC-Tuned VCO", Seong-Mo Yim and Kenneth K. O, IEEE 2001 Custom Integrated Circuits Conference, pp. 205-208.
"A 2.2 GHz CMOS VCO with Inductive Degeneration Noise Suppression", Pietro Andreani and Henrik Sjöland, IEEE 2001 Custom Integrated Circuits Conference, 3 pgs.

* cited by examiner

*Primary Examiner*—Michael B Shingleton
(74) *Attorney, Agent, or Firm*—Eschweiler & Associates, LLC

(57) ABSTRACT

A circuit arrangement for generating a reference current and also an oscillator circuit having the circuit arrangement are disclosed the arrangement includes a capacitance connected to an input of a voltage-controlled current source. Two amplifiers having different drive capabilities, between which a switching can be effected, are provided to drive the capacitance. An LC oscillator can be fed with the reference current in a current-controlled manner and at the same time in a particularly low-noise manner.

13 Claims, 6 Drawing Sheets

CIRCUIT ARRANGEMENT FOR GENERATING A REFERENCE CURRENT AND OSCILLATOR CIRCUIT HAVING THE CIRCUIT ARRANGEMENT

REFERENCE TO RELATED APPLICATIONS

This application is a continuation of PCT/DE03/00308, filed Feb. 4, 2003, which was not published in English, that claims the benefit of the priority date of German Patent Application No. DE 102 09 044.0, filed on Mar. 1, 2002, the contents of which both are herein incorporated by reference in their entirety.

FIELD OF THE INVENTION

The present invention relates to a circuit arrangement for generating a reference current and to an oscillator circuit having the circuit arrangement for generating a reference current.

BACKGROUND OF THE INVENTION

Oscillators having an oscillating frequency that can be set over a wide range are normally realized as LC oscillators. In this case, the frequency of the resonant circuit is determined by at least one capacitance and at least one inductance. The oscillating frequency results here from the reciprocal of the product of $2\pi$ and the root of the LC product.

In order to adjust the oscillating frequency usually the inductance is constant but the capacitance is made adjustable. Varactor diodes in which the junction capacitance is dependent on an applied DC voltage potential are normally used as adjustable capacitances.

One important area of application for such LC oscillators is mobile radio devices that require radio frequency carrier oscillations in order to perform frequency conversions from radio frequencies to baseband and vice versa.

In order to compensate for losses in the LC resonant circuits, the latter are usually deattenuated by means of a so-called negative impedance. By way of example, cross-coupled MOS field-effect transistors that are fed with a reference current are provided for this purpose. The reference current that feeds an LC oscillator is subject to stringent requirements with regard to its phase noise. With regard to the phase noise, reference-current-fed LC oscillators are very sensitive to the interference and noise inflows in the reference current.

The document Y. Seong-Mo and K. O. Kenneth, Demonstration of a Switched Resonator Concept in Dual-Band Monolithic CMOS LC-Tuned VCO, IEEE 2001 Custom Integrated Circuits Conference, pp. 205–208, IEEE/CiCC 2001, ISBN 0-7803-6591-7, specifies a reference-current-fed LC oscillator as described above.

The described problem area of reducing the phase noise of a reference current source is reduced in the case of an LC oscillator in the document P. Andreani and H. Sjöland, A 2.2 GHz CMOS VCO with Inductive Degeneration Noise Suppression, IEEE 2001 Custom Integrated Circuits Conference, pp. 197–200, IEEE CICC 2001, ISBN 0-7803-6591-7, by virtue of the fact that LC filter structures are provided in series with the current source. However, filters of this type are complicated to realize.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a circuit arrangement for generating a reference current and also an oscillator circuit having the circuit arrangement in which the phase noise is reduced without additional filter structures.

With regard to the circuit arrangement for generating a reference current, the circuit arrangement for generating a reference current comprises a voltage-controlled current source having a control input and having an output for tapping off the reference current. The arrangement also comprises a capacitance connected to the control input of the voltage-controlled current source, and a series circuit comprising a first amplifier having a first gain factor and a switch. The series circuit is connected to the control input of the voltage-controlled current source. Further, the arrangement includes a second amplifier having a second gain factor, which is connected to the control input of the voltage-controlled current source, and a selection circuit, which is connected to a control input of the switch for the purpose of changing over between a first and a second operating mode of the circuit arrangement.

In accordance with the present invention, the circuit arrangement for generating a reference current can advantageously be operated in two operating modes. In a first operating mode, the switch that forms a series circuit with the first amplifier is closed, and in a second operating mode the switch is open. Consequently, in the first operating mode, the gain factors of the first and second amplifiers determine the charging or charge reversal of the capacitance and also the driving of the voltage-controlled current source, while in the second operating mode only the gain factor of the second amplifier influences the charging or charge reversal behavior of the capacitance and also the driving of the voltage-controlled current source.

The first and second amplifiers are preferably designed with regard to their driver strength, that is to say with regard to their gain factor such that the first gain factor is greater than the second gain factor.

The first and second amplifiers may preferably be formed as differential amplifiers.

Preferably, the first and second amplifiers are differential-voltage-controlled current sources.

The first gain factor of the first amplifier is preferably designed precisely so as to ensure a particularly rapid charging of the capacitance connected to the control input of the voltage-controlled current source.

The gain factor of the second amplifier is preferably dimensioned such that precisely the maintenance charge of the capacitance is provided, that is to say that the driver capability of the second amplifier precisely suffices to compensate for leakage currents of the capacitance and/or of the switch.

In accordance with the present invention the second amplifier, which consequently has a comparatively low gain or a low driver capability, may be formed in a particularly low-noise manner.

Since a particularly rapid charging or charge reversal of the capacitance is possible by means of the connectable amplifier, the present circuit arrangement may be used in particular for the supply of current to those LC oscillators which are provided in mobile radio devices that have a standby mode and are not continuously switched on.

As explained, it is possible in accordance with the present invention on the one hand to enable the reference current to be generated with particularly low phase noise and on the other to support a current saving mode.

Overall, the present invention is consequently particularly well suited to the operation of LC oscillators in mobile radio devices.

Other functional units in radio frequency circuits that are operated with current sources that are intended to have a low noise can also preferably be driven by means of the present invention, for example radio frequency mixers.

In accordance with a further, preferred embodiment of the present invention, the first and second amplifiers are controlled current sources formed using MOS circuit technology, each having a differential amplifier. The differential amplifiers each comprise two MOS transistors. The channel width to channel length ratio of the MOS transistors in the first amplifier is greater than the channel width to channel length ratio of the MOS transistors in the second amplifier. The channel width to channel length ratio of the MOS transistors in the first amplifier is preferably large with respect to the value 1. The channel width to channel length ratio of the MOS transistors in the second amplifier is preferably small with respect to 1. A rapid charging of the capacitance is possible by means of the transistors in the first amplifier with the large channel width in conjunction with short channel length. After the changeover to the second operating mode, in which the MOS transistors in the second amplifier with the small channel width and the long channel length take effect, there is compensation of leakage currents with particularly low noise elements on the reference current.

In this case, the feedthrough of interference from the supply voltage to the reference current is particularly small. In the second operating mode, the voltage-controlled current source accordingly behaves like an ideal, noise-free reference source without the reference voltage value stored on the capacitance varying with respect to time.

It is advantageous to develop the present actuating circuit in the circuit arrangement to form a control loop, by providing a feedback path that couples the output of the voltage-controlled current source to a respective control input of the first and second amplifiers.

The control loop described enables a particularly precise setting of the reference current, but in particular a high constancy of the reference current set, by influencing the reference voltage that is dropped across the capacitance and drives the voltage-controlled current source.

The accuracy of the control described can be improved further by embodying the voltage-controlled current source as a first voltage-controlled current source and by providing a second voltage-controlled current source, having a control input connected to the control input of the first voltage-controlled current source and having an output connected to the input of the feedback path.

The second voltage-controlled current source operates as a reference current source that is driven with the same reference voltage as the actual first voltage-controlled current source. The reference current that can be derived at the first voltage-controlled current source may be set precisely for example by setting a current mirror ratio at the first and second voltage-controlled current source.

An even further improvement in the control loop of the present invention can be obtained in a simple manner by virtue of the fact that the first and second amplifiers, in addition to each having a first control input connected to the feedback path, each have a second control input, a reference voltage source being provided, which is coupled to the two second control inputs.

A reference voltage source, for example a bandgap generator, makes it possible to provide a particularly precise reference signal with the aid of which the two amplifiers can in turn set a particularly precise reference voltage that in turn contributes to providing a reference current that can be set very precisely.

The first and, if a second one is present, also the second voltage-controlled current source are preferably formed using MOS circuit technology. In this case, the voltage-controlled current source is preferably formed as a MOS transistor that operates as a current source. The source terminal is preferably short-circuited with the bulk terminal. In the case of such a MOS transistor operating as a current source, the transconductance of the transistor and its channel length and also the reference voltage that drives it determine the noise properties of the reference current provided.

The reference current of a MOS transistor acting as a current source is determined by the reference voltage that is present between the gate and source terminals of the MOS transistor and is provided depending on the operating state of the first and/or second amplifier. Since, with the present invention, the noise properties of the reference voltage are particularly low in the second operating mode, the reference current also exhibits particularly low noise.

With regard to the oscillator circuit, the oscillator circuit comprises a circuit arrangement comprising an LC resonant circuit, and a deattenuation amplifier coupled to the LC resonant circuit. The oscillator circuit further comprises a reference current input for feeding the oscillator circuit, which input is connected to the LC resonant circuit or to the deattenuation amplifier. The reference current input is connected to the output of the voltage-controlled current source of the circuit arrangement for generating a reference current.

On account of the particularly low-noise and interference-free reference current that can be generated in accordance with the present invention, the oscillator circuit provides a signal having an oscillating frequency which exhibits particularly low phase noise.

BRIEF DESCRIPTION OF THE DRAWINGS

The invention is explained in more detail below giving a plurality of exemplary embodiments with reference to the drawings.

In the figures.

DETAILED DESCRIPTION OF THE INVENTION

Figure 1:
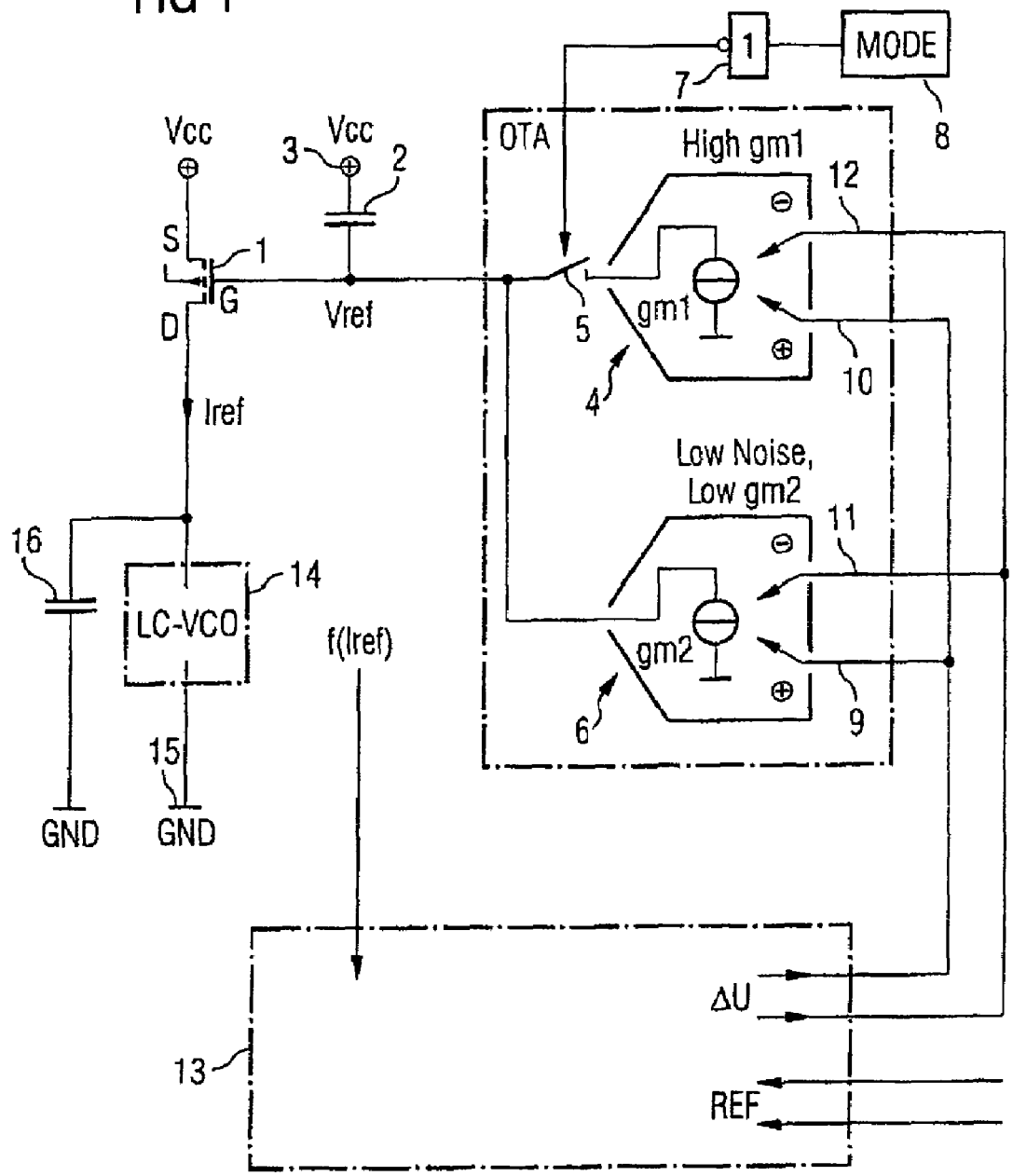
FIG. 1 is a simplified block diagram of a first exemplary embodiment of a circuit arrangement for generating a reference current in accordance with the present invention.

FIG. 1 shows a circuit arrangement for generating a reference current $I_{ref}$ having a voltage-controlled current source 1 formed as a MOS field-effect transistor having a capacitance 2, which is connected to the gate terminal of the current source 1 by one terminal and to a supply potential terminal 3 by a further terminal, having a first amplifier 4, the output of which is connected to the control input of the current source 1 via a switch 5, and having a second amplifier 6, the output of which is likewise connected to the control input, that is to say to the gate terminal of the current source 1. The switch 5 has a control terminal, which is coupled via an inverter 7 to the output of a selection circuit 8, which effects changeover from a first operating mode to a low-noise, second operating mode.

The first and second amplifiers 4, 6 are in each case constructed as a differential-voltage-controlled current source and realized using MOS circuit technology. The first and second amplifiers each have a first input 9, 10 and each have a second input 11, 12. The first and second inputs of the first and second amplifiers 4, 6 are connected to a feedback reference unit 13, which provides a differential voltage ΔU at its output. The reference unit 13 has two control inputs to which a reference signal (Ref) is fed, on the one hand, and a signal $f(I_{ref})$ derived from the reference current is fed, on the other hand. The output of the voltage-controlled current source 1, namely the drain terminal of the MOS current source transistor 1, is connected to a reference current input of a voltage-controlled LC oscillator 14, which is furthermore coupled to a reference potential terminal 15. A further capacitance 16 is connected in parallel with the LC oscillator 14 with respect to the reference potential terminal 15. The source terminal of the P-channel current source transistor 1 is connected to the supply potential terminal 3 and also the bulk terminal of the current source transistor 1. The transconductance gm1 of the first amplifier 4 is significantly greater than the transconductance gm2 of the second amplifier 6. The second amplifier 6 is formed as a low-noise amplifier.

The driver capability of the first amplifier 4 is designed such that a particularly rapid charging and charge reversal of the capacitance 2 is possible with switch 5 closed. Switch 5 is closed, for example, when the oscillator 14 is switched on, after a standby mode thereof, until the capacitance 2 is charged to its desired voltage, namely that voltage which brings about precisely the reference current at the output of the current source 1. The transconductance gm2 of the second amplifier 6 is designed such that leakage currents in the switch 5 and also leakage currents of the capacitance 2 are precisely compensated for, in such a way that the voltage dropped across the capacitance 2 remains constant. In this second operating mode, the switch 5 is open. On account of the requisite low driver capability gm2 of the second amplifier 6, the latter can be designed in a particularly low-noise manner, so that the oscillator 14 can be fed with a reference current $I_{ref}$ during normal operation, the oscillator 14 having a particularly low phase noise.

Figure 2:
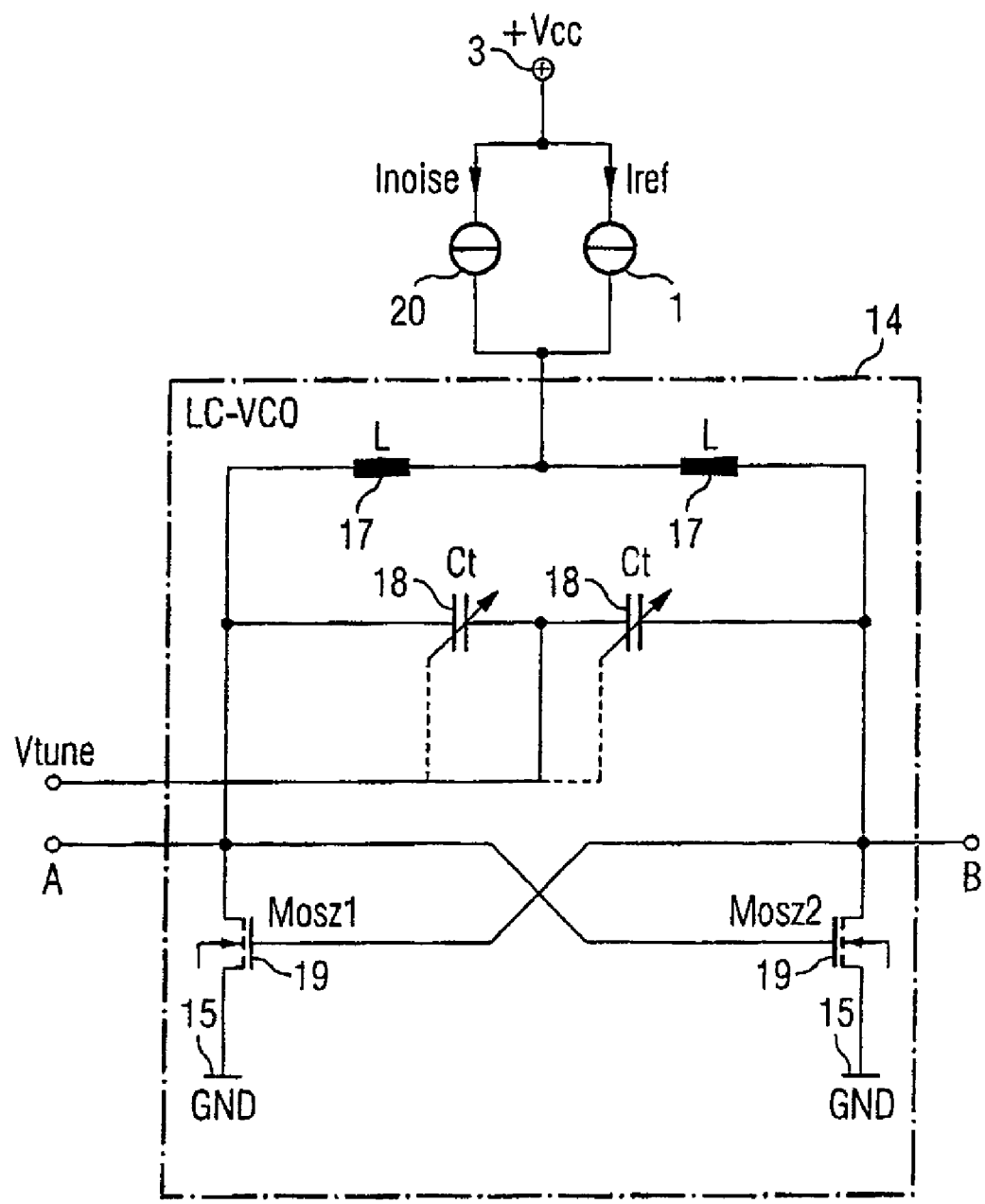
FIG. 2 is a prior art LC oscillator with a tunable frequency in conjunction which the circuit arrangement in accordance with FIG. 1 can advantageously be employed.

FIG. 2 shows a conventional voltage-controlled LC oscillator 14 in accordance with FIG. 1. The LC oscillator is constructed symmetrically with two fixed-value inductances 17 connected, by a respective terminal, to one another and to the output of a reference current source 1. A noise current source 21 that characterizes parasitic properties is depicted in parallel with the reference current source 1. The inductances 17 are coupled to a respective adjustable capacitive element, namely a respective varactor diode 18. The varactor diodes 18 each have a control input, to which a tuning voltage $V_{tune}$ is fed. This tunable LC resonant circuit is coupled to a deattenuation amplifier. The deattenuation amplifier comprises two cross-coupled n-channel field-effect transistors 19 connected to reference potential terminal 15. The output signal A, B of the oscillator 14 can be tapped off at the symmetrical circuit node between LC tank 17, 18 and deattenuation amplifier 19.

Figure 3A:
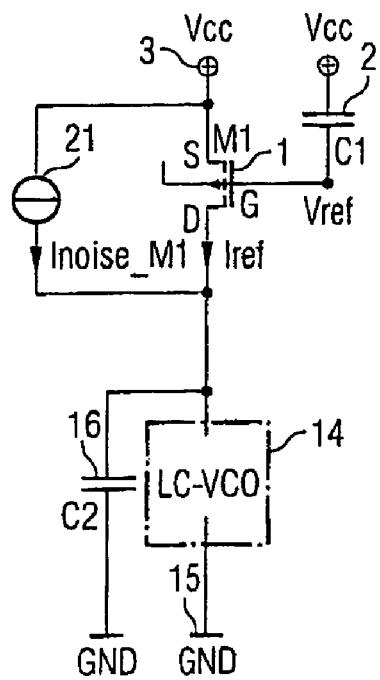
FIG. 3a is an ideal MOS current source.
Figure 3B:
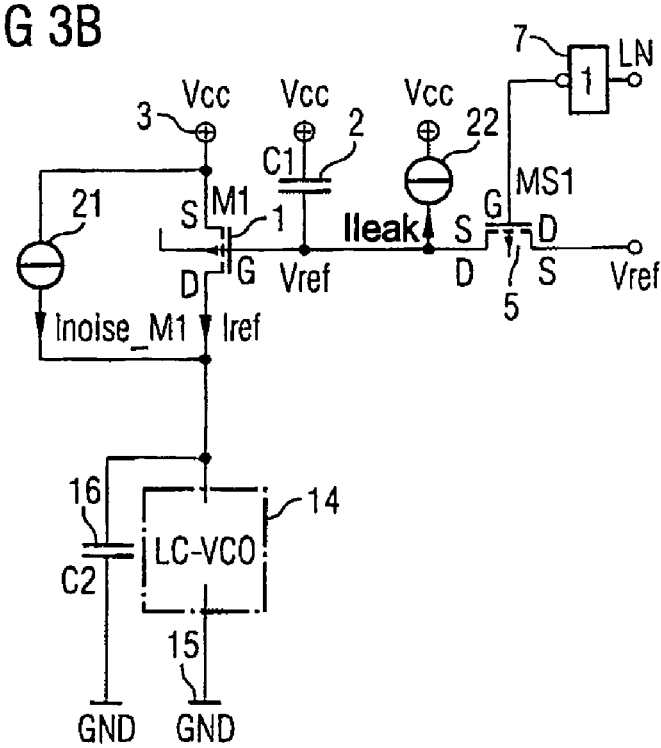
FIG. 3b is the current source in accordance with FIG. 3a, but additionally with a switch beset by leakage current.
Figure 3C:
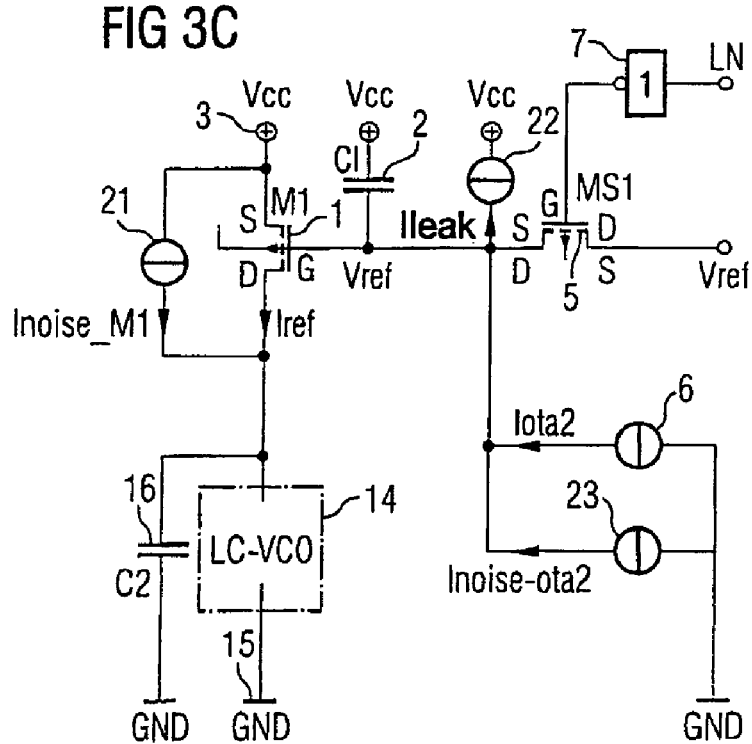
FIG. 3c is the current source in accordance with FIG. 3b with a compensation current source beset by noise.

FIGS. 3a to 3c serve to provide a better understanding of the noise conditions when driving LC oscillators with a reference current.

FIG. 3a shows the LC oscillator 14 with parallel backup capacitance 16, which oscillator is connected to the reference current source 1 for its reference current supply, the control input of which reference current source is connected to the capacitance 2. A current source 21 representing the parasitic noise inflows of the current source 1 is depicted in parallel with the controlled path of the voltage-controlled current source 1. With the current source 21, the controlled current source 1 represents a real MOSFET. With such a reference current supply of the oscillator 14, there are no further noise sources present. The noise contribution brought about by the transistor 1 itself is comparatively small.

FIG. 3b shows the circuit in accordance with FIG. 3a, but extended by the switch that is in this case formed as a MOS switch 5 and couples the gate terminal of the current source 1 to the amplifier 4 (not depicted here). The control input, that is to say the gate terminal, of the p-channel switching transistor 5 is connected to inverter 7. However, the switch 5 brings about leakage currents represented by an additional parasitic current source 22. The unavoidable leakage currents that are brought about by the switch 5 and are represented by current source 22 lead to a discharge of the capacitance 2, however, which is undesirable.

FIG. 3c is a development of the circuit of FIG. 3b and additionally has a current source 6 besides the component specified there, which current source precisely compensates for the parasitic leakage currents represented by the current source 22. A noise current source 23 representing parasitic noise currents of the current source 6 is depicted in parallel with the current source 6. The current source 6 corresponds to the second low-noise amplifier 6 of FIG. 1.

Figure 4:
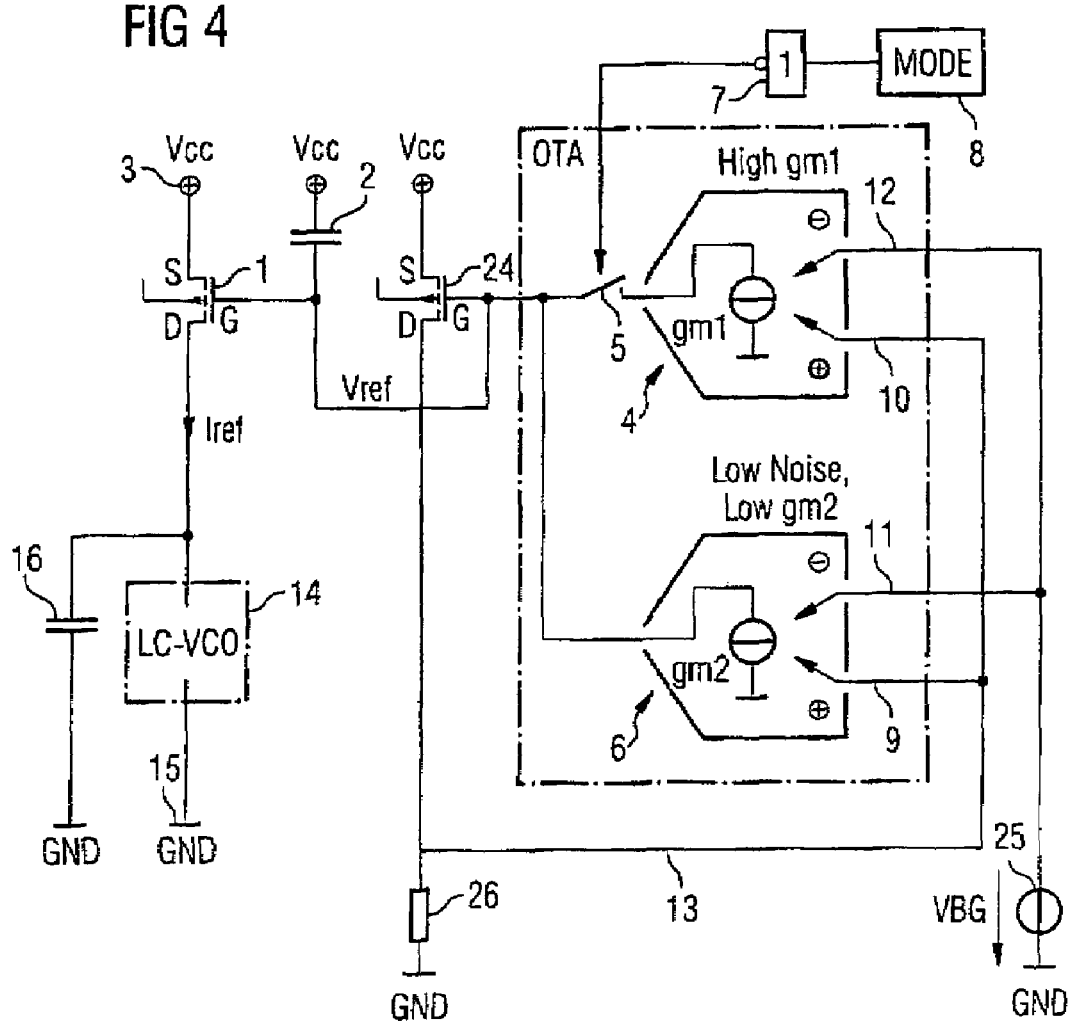
FIG. 4 is a schematic diagram of the exemplary embodiment in accordance with FIG. 1 with a control loop.

FIG. 4 shows a development of the exemplary embodiment in accordance with FIG. 1 with a control loop for controlling the reference current $I_{ref}$. A second voltage-controlled current source 24 is provided for this purpose, which is modelled on the voltage-controlled current source 1 and forms a current mirror with the voltage-controlled current source 1. In this case, the source terminal of the second voltage-controlled current source 24 is connected to the bulk terminal thereof and the supply potential terminal 3. The gate terminal of the second voltage-controlled current source 24 is connected to that of the first voltage-controlled current source 1 and thus to the switch 5 and also the output of the second amplifier 6. The drain terminal of the voltage-controlled current source 24 formed as a MOS current source is connected to the first input 10 of the first amplifier and the first input 9 of the second amplifier. The second inputs 11, 12 of the first and second amplifiers 4, 6 are connected to a reference voltage source 25 connected with respect to reference potential terminal 15. The drain terminal of the second voltage-controlled current source 24 is additionally connected with respect to the reference potential terminal 15 via a resistor 26. Apart from the embodiment of the feedback path 13, the circuit arrangement for generating a reference current in accordance with FIG. 4 corresponds to that of FIG. 1 in its construction and advantageous method of operation. In this respect, the description of the figure will not be repeated again here at this juncture.

The bandgap reference voltage source 25 provides a bandgap voltage of typically 1.2 volts. By means of the control loop described, the same bandgap voltage is also established across the resistor 26 and is accordingly present at the drain terminal of the second voltage-controlled current source 24. The current provided at the drain terminal of said MOS current source 24 thus corresponds to the quotient of bandgap voltage and resistance 26. Although the feedback loop is connected to the noninverting inputs 9, 10 of the first and second amplifiers, a negative feedback is involved, of course, since the current source 24 exhibits inverting behavior. The first and second current sources 1, 24 form a current mirror having a fixed, but settable, mirror ratio, so that the reference current $I_{ref}$ at the output of the first voltage-controlled current source 1 can be set in a preferred manner and very precisely by means of said mirror ratio and also the resistance of the resistor 26.

Figure 5:
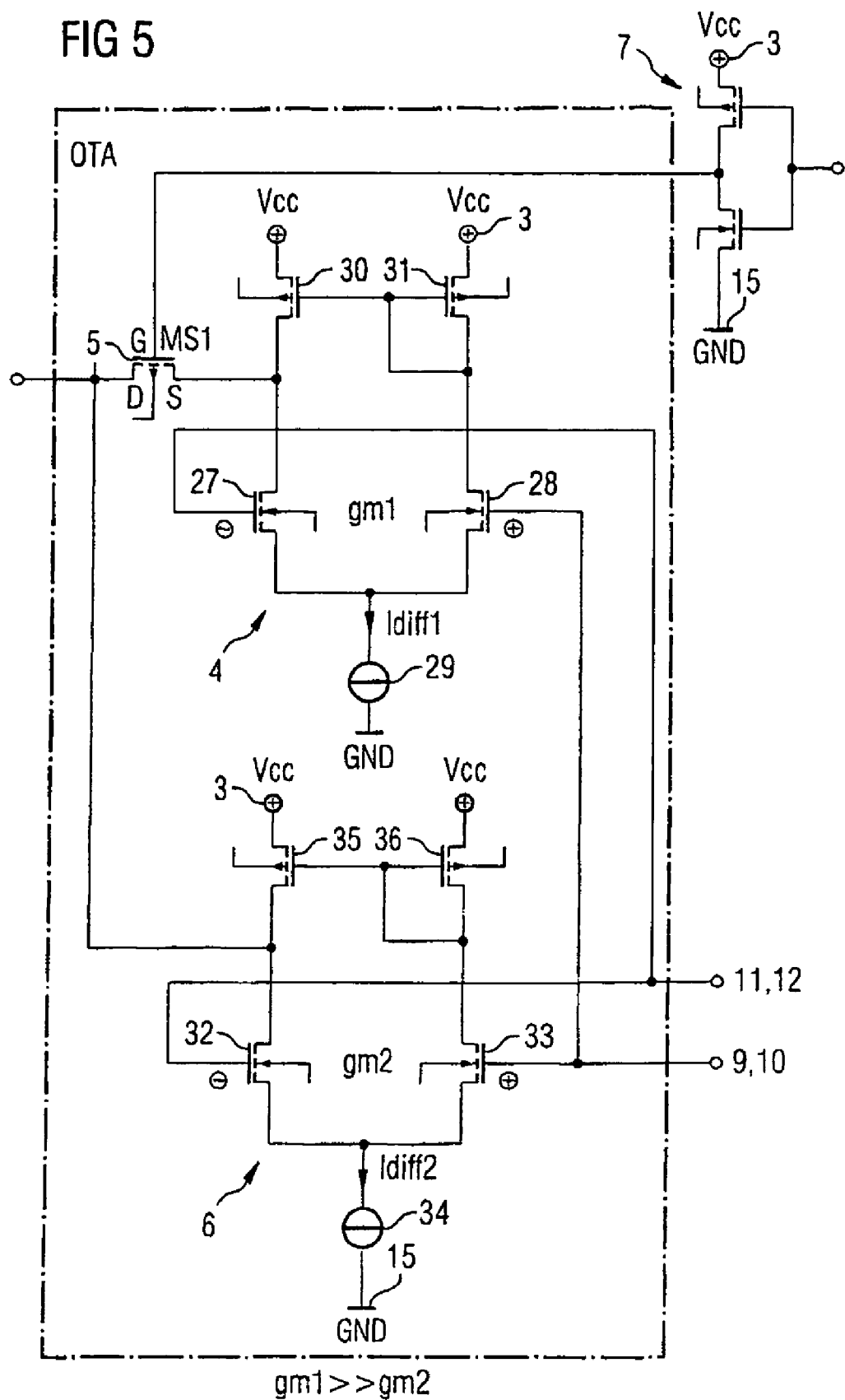
FIG. 5 is a schematic diagram of the first and second amplifiers designed as transimpedance amplifiers in accordance with the circuit diagrams of FIGS. 1, 4.

FIG. 5 shows an exemplary embodiment of the first and second amplifiers 4, 6, as are provided in the subject matters in FIG. 1 and FIG. 4, as transimpedance amplifiers formed within MOS circuit technology, so-called operational transimpedance amplifiers, OTA. In addition, the switch 5 is formed as a MOS transistor switch and inverter 7 is formed as a CMOS inverter.

The first amplifier 4, having the first transconductance gm1, comprises two NMOS transistors 27, 28, connected, by their source terminals, to one another and, via a first current source 29, to reference potential terminal 15. The transistors 27, 28 thus form a differential amplifier. A current mirror, comprising two gate-coupled PMOS transistors 30, 31, of which the latter is connected up as a MOS diode by its gate terminal being connected to its drain terminal, is connected to the two drain terminals of the transistor 27, 28. The source terminals of these current mirror transistors 30, 31 are connected to supply potential terminal 3. That current mirror transistor 30 which is not connected as a diode is connected by its drain terminal to the source terminal of the switch 5 formed as a PMOS transistor, the drain terminal of which forms the output of the amplifier arrangement, to which the output of the second amplifier 6 is also connected.

The control terminal, that is to say the gate terminal, of the transistor 5 is connected to the output of the CMOS inverter 7, to the input of which the selection circuit 8 (not depicted here) can be connected. By analogy with the first amplifier 4, the second amplifier 6 also comprises two NMOS transistors 32, 33 coupled on the source side, which are connected to the reference potential terminal 15 via a second current source 34. On the drain side, the transistors 32, 33, forming a differential amplifier with the transconductance gm2, are coupled to one another and to the supply potential terminal 3 via a further current mirror, comprising two PMOS transistor 35, 36. That drain terminal of the current mirror transistors 35, 36 which is not connected to the output of the amplifier arrangement 4, 6 is connected up as a transistor diode 36. The gate terminals of the differential amplifier transistors 27, 28, 32, 33 are connected up to one another in pairs and form the first input 9, 10 and also the second input 11, 12 of the amplifiers 4, 6.

Although the amplifiers 4, 6 apparently have the same circuit construction, they nevertheless differ significantly in design in order to ensure that the transconductance gm1 of the first amplifier 4 is large compared with the transconductance gm2 of the second amplifier 6. For this purpose, the four transistors 27, 28, 30, 31 which the first amplifier 4 comprises are designed with a particularly large channel width and a comparatively short channel length, that is to say that overall they have a comparatively large channel width to channel length ratio. This results in the great driver capability provided in accordance with the present invention for rapid charging or charge reversal of the capacitance 2 that can be connected to the output of the amplifier arrangement 4, 6. By contrast the four transistors 32, 33, 35, 36 of the second amplifier 6 have a comparatively small channel width in conjunction with a comparatively long channel length, thus resulting overall in a very small channel width to channel length ratio.

Specifically, the driver capability is designed such that leakage currents in the switch 5 and also losses in the capacitance 2 and, if appropriate, further losses can be precisely compensated for. The small channel width in combination with the long channel length leads to a low 1/f noise and thus to the low-noise operation—provided in accordance with the present principle—of a circuit, for example of an LC oscillator, connected to the output of the voltage-controlled current source 1 for tapping off the reference current. The overall result is that the transconductance gm1 of the first amplifier 4 is large in comparison with the transconductance gm2 of the second amplifier 6.

Figure 6:
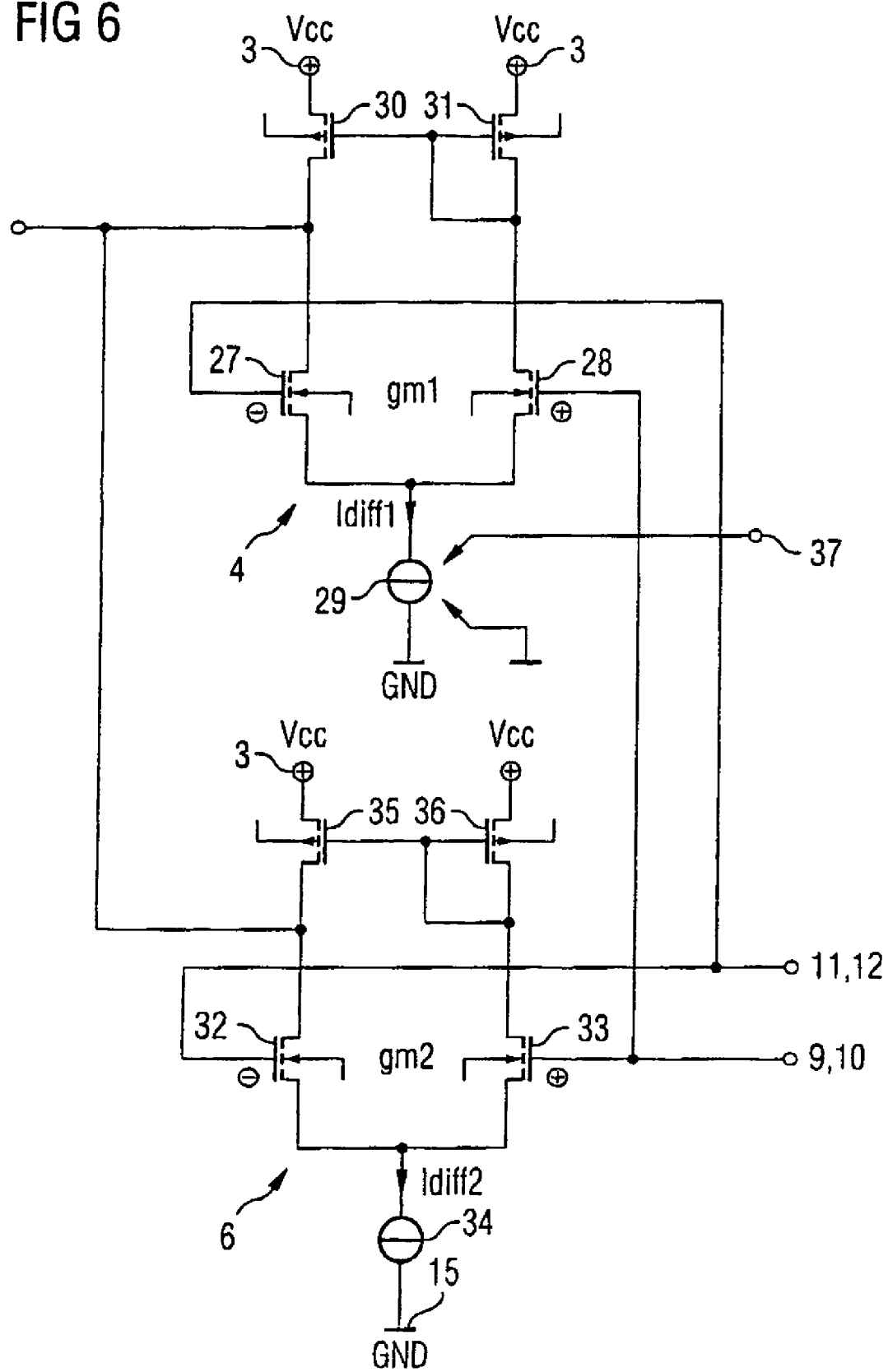
FIG. 6 is a schematic diagram illustrating a variation of the transimpedance amplifier of FIG. 5 in accordance with the present invention.

FIG. 6 shows a development of the transimpedance amplifier of FIG. 5. This transimpedance amplifier largely corresponds to that of FIG. 5 in terms of construction, circuitry, function and its advantages; in this respect, the description will not be repeated here. With regard to the subject matter of FIG. 5, the present exemplary embodiment is modified to the extent that the current source 29 of the first amplifier 4 has a control input 37, to which a control voltage is fed, as illustrated in FIG. 6. The control input replaces the switch 5 and the inverter 7 of FIG. 5, which can be omitted in the exemplary embodiment. The outputs of the amplifiers 4, 6 are thus connected directly to one another and to the control input of the current source 1 which is not depicted here. The control input 37 is connected to the selection circuit 8, which is not depicted here.

If a changeover is to be made from the high gain gm1 after charging of the capacitance 2 to the smaller gain gm2, then this is effected, in the case of the subject matter in accordance with FIG. 6, by reducing the differential current of the current source 29. The selection circuit 8 provides the requisite control signal.

In this respect, the controllable current source 29 coupled to the first amplifier 4 may be interpreted as equivalent means to the series circuit comprising the switch 5 and the first amplifier.

It goes without saying, as alternative embodiments, all the circuits presented in the context of the present invention may also be embodied using complimentary circuit technology. Thus, by way of example, MOS current sources can be realized both by means of n-channel MOS transistors and by means of p-channel MOS transistors. Moreover, the magnitude of the threshold voltage $V_{th0}$ of the MOS transistors does not play a fundamental part. Furthermore, by way of example, the function of a current mirror circuit may be embodied in simple or in complex circuit technology, for example with a cascade circuit. Such alternative embodiments of the circuit structures specified here may accordingly be regarded as equivalent means for realization of the present invention. The capacitance 16 that effects an additional voltage stabilization across the VCO may also be removed in alternative embodiments. The voltage-controlled current source 1 and the possibly provided second voltage-controlled current source 24 modelled on it may also be formed with a cascode circuit or with a negative feedback instead of the simple realizations with just one field-effect transistor that have been presented.

The current sources 29, 34 may also be embodied as a resistor, for example, in alternative embodiments in the context of the present invention.

The invention claimed is:

1. A circuit arrangement for generating a reference current, comprising:
   a voltage-controlled current source having a control input and having an output for tapping off the reference current;
   a capacitance connected to the control input of the voltage-controlled current source;
   a series circuit comprising a first amplifier having a first gain factor and a switch, wherein the series circuit is connected to the control input of the voltage-controlled current source;
   a second amplifier having a second gain factor that is connected to the control input of the voltage-controlled current source, wherein the second gain factor is configured to maintain a charge of the capacitance; and
   a selection circuit connected to a control input of the switch and configured to switch between a first and a second operating mode of the circuit arrangement associated with the first and second amplifiers, respectively, wherein at least one of
      the first and second amplifiers comprise differential voltage-controlled current sources, wherein the first gain factor is greater than the second gain factor,
      the first and second amplifiers comprise controlled current sources embodied using MOS circuit technology which each comprise a differential amplifier, each having two MOS transistors, and wherein a channel width to channel length ratio of the MOS transistors in the first amplifier is larger than the channel width to channel length ratio of the MOS transistors in the second amplifier, and
      the first amplifier is coupled to a controllable current source configured to supply current to the first amplifier, the controllable current source comprising a switch operable to switch between the first and second operating modes of the circuit arrangement.

2. The circuit arrangement as claimed in claim 1, wherein the first and second amplifiers comprise differential amplifiers.

3. The circuit arrangement as claimed in claim 1, further comprising a feedback path having an input to which the reference current or a signal derived from the reference current is fed, and having an output connected to a respective control input of the first and second amplifiers.

4. The circuit arrangement in claim 3, wherein the voltage-controlled current source comprises a first voltage-controlled current source, and a second voltage-controlled current source having a control input connected to a control input of the first voltage-controlled current source, and having an output connected to the input of the feedback path.

5. The circuit arrangement as claimed in claim 3, wherein the first and second amplifiers each have a first control input and each have a second control input, wherein the first control inputs are connected to the feedback path and the second control inputs are coupled to a reference voltage source.

6. The circuit arrangement as claimed in claim 1, wherein the circuit arrangement is constructed using metal oxide semiconductor circuit technology.

7. An oscillator system, comprising:
   an oscillator circuit, comprising:
      an LC resonant circuit;
      a deattenuation amplifier coupled to the LC resonant circuit, and
      a reference current input for feeding the oscillator circuit, wherein the input is connected to the LC resonant circuit or to the deattenuation amplifier, and
   a reference current generation circuit, comprising:
      a voltage-controlled current source having a control input and having an output for tapping off the reference current;
      a capacitance connected to the control input of the voltage-controlled current source;
      a series circuit comprising a first amplifier having a first gain factor and a switch, wherein the series circuit is connected to the control input of the voltage-controlled current source;
      a second amplifier having a second gain factor that is connected to the control input of the voltage-controlled current source; and
      a selection circuit connected to a control input of the switch and configured to switch between a first and a second operating mode of the circuit arrangement associated with the first and second amplifiers, respectively.

8. The oscillator system as claimed in claim 7, further comprising a stabilization capacitance connected to the reference current input of the oscillator circuit.

9. An oscillator system, comprising:
   an oscillator circuit configured to generate a signal having a frequency that is a function of an input voltage, and wherein the oscillator circuit comprises a compensation circuit providing compensation to the oscillator circuit based on a reference current supplied thereto; and
   a reference current generation circuit coupled to the oscillator circuit, and configured to generate the reference current and supply such reference current to the oscillator circuit, the reference current generation circuit comprising:
      a voltage controlled current source having a control terminal comprising an input and having an output providing the reference current to the oscillator circuit;
      a capacitance coupled to the input of the voltage controlled current source; and
      a multi-mode charging system coupled to the capacitance, and configured to charge the capacitance at a first rate in a first mode, and charge the capacitance at a second rate in a second mode, wherein the first rate is greater than the second rate, and wherein the charging of the capacitance affects a voltage at the control terminal of the voltage controlled current source, thereby affecting a magnitude of the reference current generated by the voltage controlled current source, wherein the multi-mode charging system comprises:

a first amplifier having a first gain factor associated therewith; and a second amplifier having a second gain factor associated therewith, wherein the first gain factor is greater than the second gain factor, and wherein the first amplifier is operable to drive the capacitance in the first mode and the second amplifier is operable to drive the capacitance in the second mode.

10. The oscillator system of claim 9, further comprising a selection circuit connected to the multi-mode charging system, and configured to switch the multi-mode charging system between the first and second modes.

11. The oscillator system of claim 9, wherein the second amplifier is configured to substantially maintain a charge of the capacitance during the second mode.

12. The oscillator system of claim 10, wherein the first amplifier and the second amplifier are operable to drive the capacitance in the first mode.

13. A circuit arrangement for generating a reference current, comprising:

a voltage-controlled current source having a control input and having an output for tapping off the reference current;

a capacitance connected to the control input of the voltage-controlled current source;

a series circuit comprising a first amplifier having a first gain factor and a switch, wherein the series circuit is connected to the control input of the voltage-controlled current source;

a second amplifier having a second gain factor that is connected to the control input of the voltage-controlled current source; and a selection circuit connected to a control input of the switch and configured to switch between a first and a second operating mode of the circuit arrangement associated with the first and second amplifiers, respectively, wherein the series circuit comprising the first amplifier and the switch, and the second amplifier are connected to the control input of the voltage-controlled current source directly.

* * * * *